United States Patent Office 3,791,948
Patented Feb. 12, 1974

3,791,948
PREFERENTIAL ETCHING IN GaP

Richard Wayne Dixon, Morristown, William Harold Hackett, Jr., Whippany, and Thomas Edward McGahan, North Plainfield, N.J., assignors to Bell Telephone Laboratories, Incorporated, Murray Hill, N.J.

No Drawing. Filed Nov. 1, 1971, Ser. No. 194,201
Int. Cl. B23p *1/00*
U.S. Cl. 204—129.75 4 Claims

ABSTRACT OF THE DISCLOSURE

The specification describes a process for etching n-type gallium phosphide in preference to p-type. The n-type material is anodized in a solution of sodium or potassium hypochlorite and hydrochloric acid.

BACKGROUND OF THE INVENTION

(1) Field of the invention

This invention relates to etching processes for gallium compound semiconductors and, more particularly, to an anodic etching process for the selective removal of donor-doped, or n-type, gallium phosphide in preference to p-type material.

(2) Description of the prior art

Selective etchants which are capable of etching p-type material in preference to n-type material are known for various semiconductors including the III–V compounds such as gallium phosphide. However, it is desirable from the point of view of processing flexibility to have the conjugate choice of etching n-type material in preference to p-type. Effective n-type preferential etches for gallium phosphide are rare, if they exist at all.

SUMMARY OF THE INVENTION

According to this invention, a simple, convenient anodic etching solution is used to effectively remove n-type gallium phosphide while not appreciably attacking p-type gallium phosphide. This etchant is an aqueous solution of sodium or potassium hypochlorite and hydrochloric acid. Effective proportions for the solution are defined by weight ratios of acid to hypochlorite in the range of 2:1 to 1:2 with water equivalent to a concentration of hypochlorite in the range of 0.5 N to 1.0 N and a concentration of HCl in the range of 6 N to 18 N.

The etch process is performed electrolytically with the n-material biased at a positive potential of the order of 0.8 to 5.0 volts.

The following example is provided to demonstrate the effectiveness of the etch solution of the invention.

An aqueous solution was prepared from a 5.25% wt. aqueous solution of NaOCl and approximately 12 N hydrochloric acid in a volume ratio of hypochlorite to acid of 7:1. The 5.25% hypochlorite solution is convenient since it is commercially available. A small volume (17 ml.) was used in this example and was mixed directly. If significantly larger quantities are prepared, the acid should be added slowly to avoid excessive gas evolution from the solution.

Preferential etching in this solution was obtained by immersing a gallium phosphide diode into the solution and biasing the diode positive with respect to an immersed stainless steel or platinum cathode. The characteristics of the cathode are largely immaterial to the process. The diode used was .015" w. x .015" d. x .010" h. mounted on a T0–18 header and had a cleaved surface perpendicular to the p-n junction for observing the extent of the etching. The p-n junction was formed by liquid phase epitaxy (Zn, O-doped p-layer) on a solution grown Te-doped n-type substrate. However, the specific characteristics of the p-n junction or the technique used in its formation are not known to have a qualitative effect on the etching process (although the etch rate was found to be influenced by doping densities as would be expected). The temperature of the etching was at or near room temperature. The etching time was five minutes. The diodes carried electrical contacts and a positive potential of 1.0 volts was applied between the n-contact and the cathode. An etch rate of the order of 2 microns per minute was measured on n-type material having a resistivity of approximately $2\times10^{17}$ cm.$^{-3}$ to $1\times10^{18}$ cm.$^{-3}$. Etching of the p-material was negligible after removal of 10 microns.

It was also found that etching proceeds in the absence of the bias, though at a slower rate, and that etching of n-material can be photosensitized as with other semiconductors.

While this description is in terms of a gallium phosphide diode, it will be evident that it is applicable to any GaP device (e.g., a field-effect device) which incorporates one or more p-n junctions. In a broader sense, it is applicable to gallium compound semiconductors, such as gallium arsenide and mixtures of gallium arsenide and gallium prosphide.

Various additional modifications and deviations of this preferential etch technique will occur to those skilled in the art. All such variations that basically rely on the teachings through which this invention has advanced the art are properly considered to be within the scope of this invention.

What is claimed is:

1. A process for preferentially etching n-type gallium compound semiconductor material comprising the steps of:

immersing a gallium compound body containing both p-type and n-type exposed regions in an aqueous etching solution of sodium or potassium hypochlorite and hydrochloric acid in which the weight ratio of acid to hypochlorite is in the range of 2:1 to 1:2 with water equivalent to a concentration of hypochlorite in the range of 0.5 N to 1.0 N and a concentration of HCl of 6 N to 18 N and passing an electroetching current through the body to etch the n-type region in preference to the p-type region.

2. The process of claim 1 in which the said ratio is approximately 0.8 and the concentration of hypochlorite is of the order of 0.7 N and the concentration of HCl is of the order of 12 N.

3. The process of claim 1 in which the gallium compound semiconductor material is selected from the group consisting of gallium phosphide, gallium arsenide and mixtures thereof.

4. The process of claim 3 in which the gallium compound semiconductor material is gallium phosphide.

References Cited

UNITED STATES PATENTS 2,481,306 9/1949 Gall et al. ........ 204—129.75
2,829,098 4/1958 Saubestre et al. .... 204—129.75

TA-HSUNG TUNG, Primary Examiner

U.S. Cl. X.R.

156—7.17; 204—129.8